United States Patent
Kim et al.

(10) Patent No.: US 7,479,453 B2
(45) Date of Patent: Jan. 20, 2009

(54) METHOD OF MANUFACTURING SEMICONDUCTOR DEVICE

(75) Inventors: Jung Geun Kim, Seoul (KR); Ki Hong Yang, Seongnam-si (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 287 days.

(21) Appl. No.: 11/159,306

(22) Filed: Jun. 23, 2005

(65) Prior Publication Data

US 2006/0108689 A1 May 25, 2006

(30) Foreign Application Priority Data

Nov. 24, 2004 (KR) ............. 10-2004-0097157

(51) Int. Cl.
*H01L 21/44* (2006.01)
(52) U.S. Cl. ............... 438/687; 257/758
(58) Field of Classification Search ........... 257/758; 438/795–799, 166, 622, 687
See application file for complete search history.

(56) References Cited

U.S. PATENT DOCUMENTS

| 5,518,962 | A  | * | 5/1996  | Murao ........... 438/624 |
| 6,190,963 | B1 | * | 2/2001  | Zhang et al. ...... 438/254 |
| 6,492,281 | B1 | * | 12/2002 | Song et al. ....... 438/715 |
| 6,657,299 | B2 | * | 12/2003 | Lee et al. ........ 257/737 |
| 2003/0173671 | A1 | | 9/2003 | Hironaga et al. |
| 2004/0022960 | A1 | * | 2/2004 | Rhee et al. ....... 427/563 |

FOREIGN PATENT DOCUMENTS

| JP | 08-088224    | 4/1996  |
| JP | 2001-210725  | 8/2001  |
| JP | 2002-353212  | 12/2002 |
| KR | 1989-0005819 | 5/1989  |
| KR | 100367499    | 12/2002 |

* cited by examiner

*Primary Examiner*—Zandra Smith
*Assistant Examiner*—Sonya D McCall Shepard
(74) *Attorney, Agent, or Firm*—Lowe Hauptman Ham & Berner, LLP

(57) ABSTRACT

A method of manufacturing a semiconductor device in a MLM process to reduce compression stress of a metal line or a HDP oxide film, and to reduce compression stress in a subsequent metal line thermal treatment process. It is thus possible to reduce generation of a crack caused by compression stress. Further, by obviating a heterogeneous interface becoming a cause of a crack and stabilizing the interface of an unstable TEOS oxide film, generation of a crack in a semiconductor device can be reduced.

8 Claims, 9 Drawing Sheets step RT (BEFORE HEATING ; as Dep. STATE)

step at 450°C step at RT (AFTER COOLING)

heating(450°C)

METHOD OF MANUFACTURING SEMICONDUCTOR DEVICE

BACKGROUND

1. Field of the Invention

The present invention relates to a method of manufacturing semiconductor devices. More specifically, the present invention relates to a method of manufacturing semiconductor devices, wherein cracking can be prevented from occurring in an insulating film in a metal layer metal (hereinafter, referred to as "MLM") process.

2. Discussion of Related Art

A MLM formation method of semiconductor devices includes forming metal lines, such as aluminum (Al) and tungsten (W), and providing insulation among the metal lines using a silicon oxide film such as high density plasma (hereinafter, referred to as "HDP").

After such a metal process is completed, annealing for improved refresh characteristics and metal resistance stabilization has to be performed.

Generally, metal is several tens of times higher in the degree of thermal expansion than the insulating film. It is thus inevitable that thermal stress occurs due to a difference in the degree of thermal expansion between the metal and the oxide film upon annealing. Such thermal stress causes cracks to occur at weak points of the insulating film.

FIG. 1 is a scanning electron microscope (SEM) photograph showing cracking created in an insulating film due to thermal stress. In FIG. 1, a first insulating film crack is generated due to thermal stress and a second crack is formed due to depression by the first crack.

Furthermore, an annealing process is usually performed at a temperature of 400 to 450° C. for about 20 to 30 minutes. If an aluminum line is used, a melting temperature of aluminum is 600° C., which is high temperature of about ⅔ Tm, and thus causes liquid behavior. Accordingly, aluminum for lines shows liquid behavior during annealing process.

At this time, if cracks due to thermal stress exist, Al is infiltrated into the cracks due to a capillary phenomenon and Al volume expansion. This results in metal line bridge failure.

FIG. 2 is a SEM photograph showing metal line bridge failure. FIG. 2 shows that metal (Al) is infiltrated into a crack, and is thus connected to an underlying conduction layer, as indicated by "A".

If metal and an insulating film exist, it is inevitable that thermal stress is generated due to a difference in the degree of thermal expansion between the metal and the insulating film upon annealing. In this case, the degree of stress applied to the insulating film is compression stress of approximately −3.5E11 dyn/cm². More particularly, stress is concentrated on a metal line corner area. Often, stress which is several hundreds of times higher than ~1E9 dyn/cm² being a general thin film stress level, is generated.

Stress ($\sigma_{ox}$) applied to an insulating film due to MLM can be expressed into the following equation.

$$\sigma_{ox} = \left[\frac{E_{Al}}{(1-v_{Al})}\right] * (\alpha_{ox} - \alpha_{Al})dT = -3.5E11 \text{ dyn/cm}^2$$

where, $\sigma_{ox}$ is stress applied to an insulating film by metal,
$E_{Al}$ is the modulus of elasticity of Al (=6E11 dyn/cm²),
$v_{Al}$ is the Poisson's ratio(=0.3) of Al,
$\alpha_{Al}$ is the degree of thermal expansion (=10 ppm/k) of Al,
$\alpha_{ox}$ is the degree of thermal expansion (=0.55 ppm/k) of insulating film, and
dT is a difference between normal temperature and temperature upon annealing (=425K)

FIGS. 3A and 3B are graphs showing a stress hysteresis curve of Al and a HDP (High Density Plasma) oxide film depending upon temperature.

As can be seen from FIG. 3A, although aluminum has tensile stress at an initial stage, it is changed to compression stress since the degree of thermal expansion is high as the temperature rises. However, the compression stress is changed to tensile stress again upon cooling.

However, a seen in FIG. 3B, a HDP oxide film has compression stress at an initial stage. As temperature rises, the compression stress is changed to tensile stress, but the HDP oxide film still shows compression stress. The compression stress then increases again upon cooling.

FIGS. 4A to 4C are schematic diagrams illustrating the state of stress generated in Al and the HDP oxide film upon annealing based on the stress hysteresis curves of FIGS. 3A and 3B.

In the drawings, an arrow direction indicates a direction along which a file tries to be oriented, and the length of the arrow indicates the amount of stress.

Before heating (FIG. 4A) and in a cooling (FIG. 4C) state, Al shows tensile stress and a HDP oxide film shows compression stress. As the directions of their stress exert in an opposite direction, stress can be mitigated.

In a heating (FIG. 4B) state, however, since the stress of Al is changed to compression stress, both Al and the HDP oxide film show the compression stress. Thus, very high stress is generated.

Accordingly, as indicated by "B" in FIG. 4B, stress is concentrated on metal line bottom corner areas.

Al bottom corner areas undergo over etch of about 50% in order to remove metal line bridges upon formation of metal lines. In this case, the Al bottom corner areas are areas where an underlying TEOS oxide film is lost due to over etch.

FIG. 5 is a view illustrating an Al etch profile. From FIG. 5, it can be seen that a TEOS oxide film is lost due to over etch at the bottom corner areas.

This Al bottom area is formed as a heterogeneous film interface (TEOS/HDP) along with concentration of stress, and is very weak and susceptible to cracking.

FIG. 6 is a SEM photograph showing crack of an over-etch area and an Al infiltration phenomenon through crack. From FIG. 6, it can be seen that the Al bottom area is weak and cracked, and accordingly, there are problems of Al infiltration.

Furthermore, the TEOS oxide film contains a large amount of moisture, hydro-carbon impurity, etc. on its surface. The interface of the TEOS oxide film is very unstable and always has problems.

FIG. 7 is a graph showing the results of measuring impurities on the surface of a TEOS oxide film using SIMS.

From FIG. 7, it can be seen that a large amount of impurities, such as $H_2$, $C_xH_y$, $H_2O$, $CO$, $O_2$ and $CO_2$, is contained on the surface of the TEOS oxide film. It is thus possible to predict instability of the interface.

FIG. 8 shows the degree of TEOS/TEOS interface attack. Although only vacuum break is performed after a TEOS oxide film is deposited, the TEOS oxide film is deposited again, and only wet cleaning is performed, attack is generated in the TEOS/TEOS interface due to a high etch rate. From this, it is possible to estimate that TEOS/HDP interface adhesion is very poor.

Therefore, crack in the TEOS/HDP interface of the metal line over-etch area begins due to the aforementioned reason, and Al bridge failure occurs through the crack.

SUMMARY OF THE INVENTION

Accordingly, the present invention has been made in view of the above problems, and it is an object of the present invention to provide a method of manufacturing a semiconductor device, wherein generation of a crack in the semiconductor device can be prevented and metal line bridge failure due to the crack can also be prevented, by improving interfacial characteristics at crack-sensitive portions such as the bottom corners of the metal line or removing a heterogeneous interface causing a cause of the crack in such a manner that generation of the crack is prohibited when a stress state of a film changes at high temperature or when such stress is applied.

To achieve the above object, according to an aspect of the present invention, there is provided a method of manufacturing a semiconductor device, including the steps of (a) forming a metal line on a substrate in which a first insulating film is formed, (b) patterning the metal line, (c) forming a second insulating film on the metal line, and (d) performing a thermal treatment process, wherein before the step (c) is performed and after the step (b) is completed, (e) a thermal treatment process is performed in order to mitigate stress of the metal line.

In embodiments, the step (e) is performed in a furnace under $N_2$ and Ar gas atmosphere at a temperature of 300 to 450° C. for 20 to 60 minutes.

In embodiments, the step (e) is performed under $N_2$ gas atmosphere at a temperature of 300 to 550° C. for 10 to 60 seconds by way of a rapid thermal process (RTP).

According to another aspect of the present invention, there is provided a method of manufacturing a semiconductor device, including the steps of (a) forming a metal line on a substrate in which a first insulating film is formed, (b) patterning the metal line, (c) forming a second insulating film on the metal line, and (d) performing a thermal treatment process, wherein in the step (a), a high melting point metal component is contained in the metal line in order to increase a melting point of the metal line.

In the step (a), a high melting point material may be distributed into the metal line and then enhanced so that a high melting point metal component is contained in the metal line.

In the step (a), the high melting point metal component may be contained in the metal line by means of a co-sputter method of depositing a metal and a high melting point material at the same time.

According to still another aspect of the present invention, there is provided a method of manufacturing a semiconductor device, including the steps of (a) forming a metal line on a substrate in which a first insulating film is formed, (b) patterning the metal line, (c) forming a second insulating film on the metal line by depositing a HDP oxide film, and (d) performing a thermal treatment process, wherein upon deposition of the HDP oxide film in the step (c), a bias power is set to 3000 to 6000 Watts.

According to still another aspect of the present invention, there is provided a method of manufacturing a semiconductor device, including the steps of (a) forming a metal line on a substrate in which a first insulating film is formed, (b) patterning the metal line, (c) forming a second insulating film on the metal line, and (d) performing a thermal treatment process, wherein the first and second insulating films are formed using a homogeneous film.

In embodiments, the first and second insulating films are formed using a HDP oxide film.

In embodiments, the first and second insulating films are formed using a TEOS oxide film.

According to yet another aspect of the present invention, there is provided a method of manufacturing a semiconductor device, including the steps of (a) preparing a substrate in which a first insulating film comprised of a TEOS oxide film is formed, (b) forming a metal line on the substrate, (c) patterning the metal line, (d) forming a second insulating film on the metal line, and (e) performing a thermal treatment process, wherein before the step (b) is performed and after the step (a), (f) a plasma treatment process is performed on the first insulating film to stabilize the interface of the first insulating film.

The plasma treatment process of the step (f) may be performed under atmosphere containing one or more of Ar, $O_2$ and He using a bias power of 2000 to 6000 watt for 10 to 100 seconds.

DETAILED DESCRIPTION OF PREFERRED EMBODIMENTS

Before the embodiments according to the present invention are described, a typical method of manufacturing a semiconductor device according to an embodiment of the present invention will be first described.

FIGS. 9A to 9D are cross-sectional views for explaining a general process of manufacturing a semiconductor device according to an embodiment of the present invention.

Figure 1:
FIG. 1 is a scanning electron microscope (SEM) photograph showing crack created in an insulating film due to thermal stress.
Figure 2:
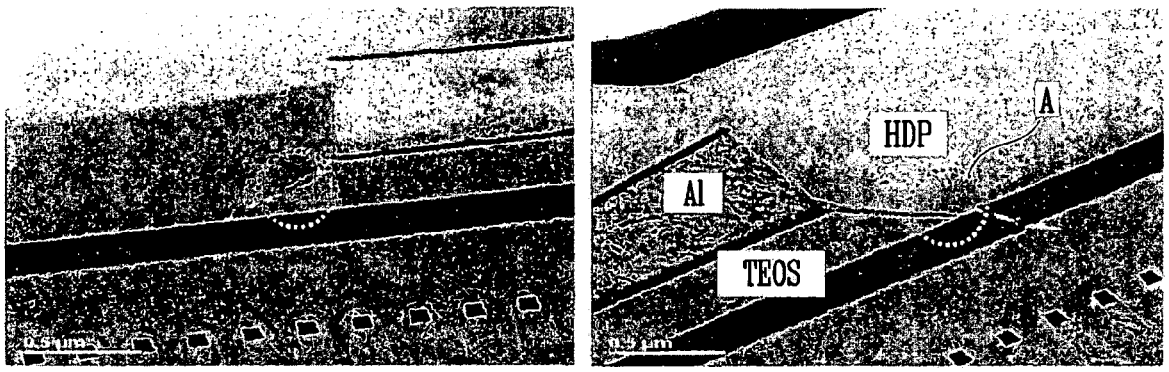
FIG. 2 is a SEM photograph showing metal line bridge failure.
Figure 3A:
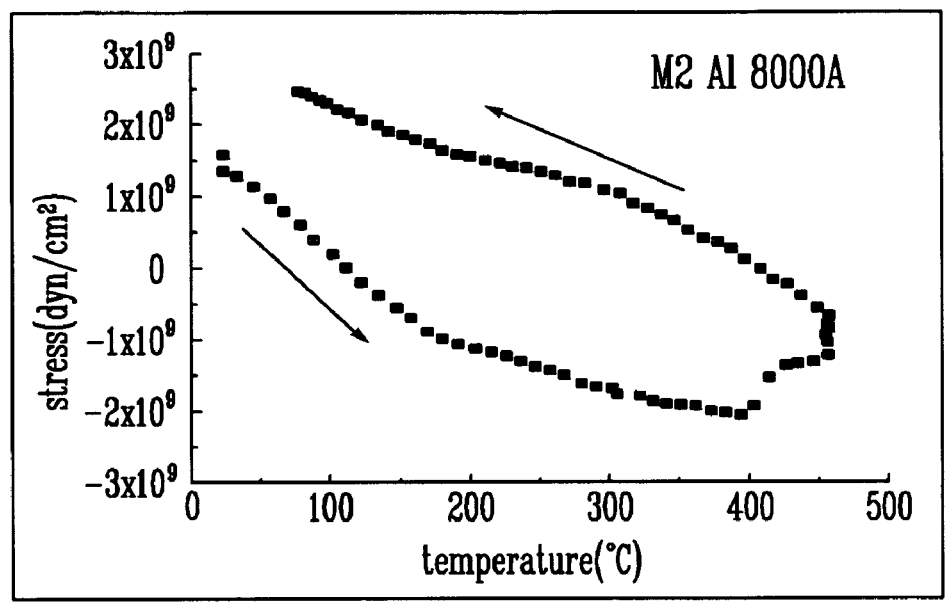
FIGS. 3A and 3B are graphs showing a stress hysteresis curve of Al and a HDP oxide film depending upon temperature.
Figure 3B:
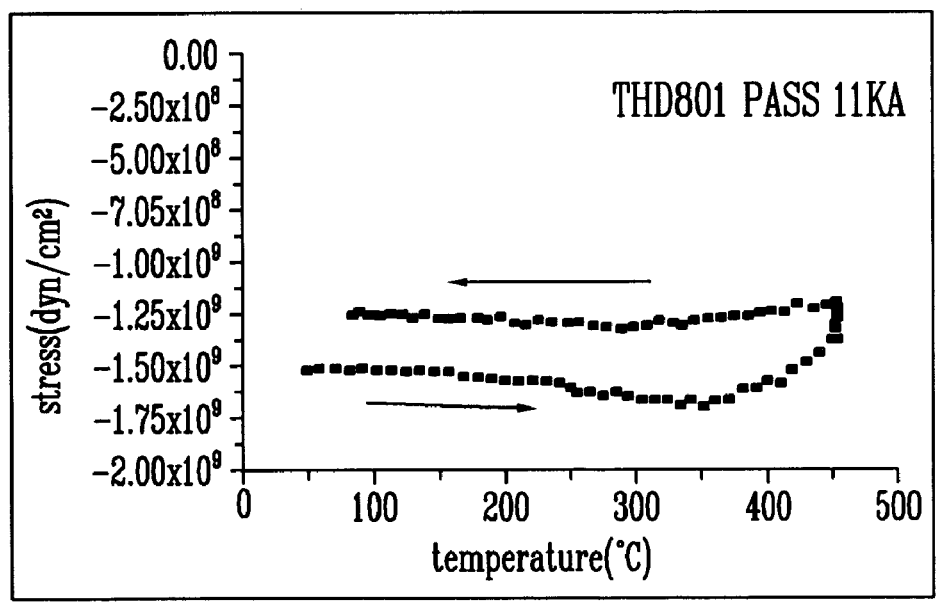
Figure 4A:
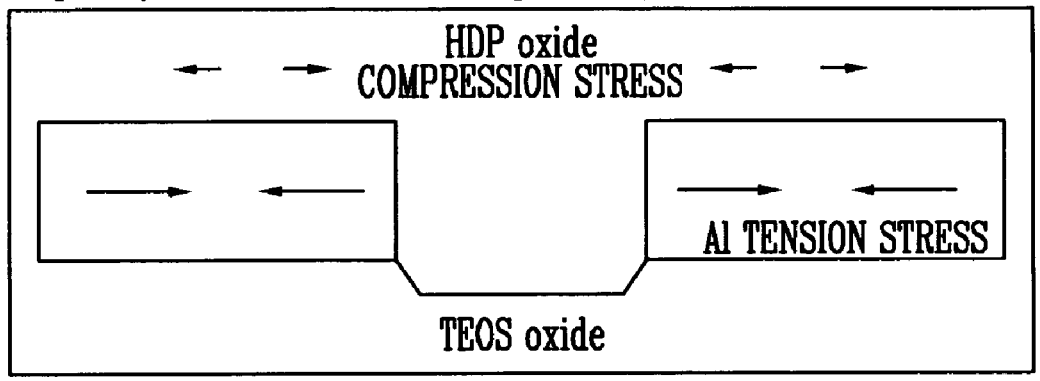
FIGS. 4A to 4C are schematic diagram illustrating the state of stress generated in Al and the HDP oxide film upon annealing based on the stress hysteresis curves of FIGS. 3A and 3B.
Figure 4B:
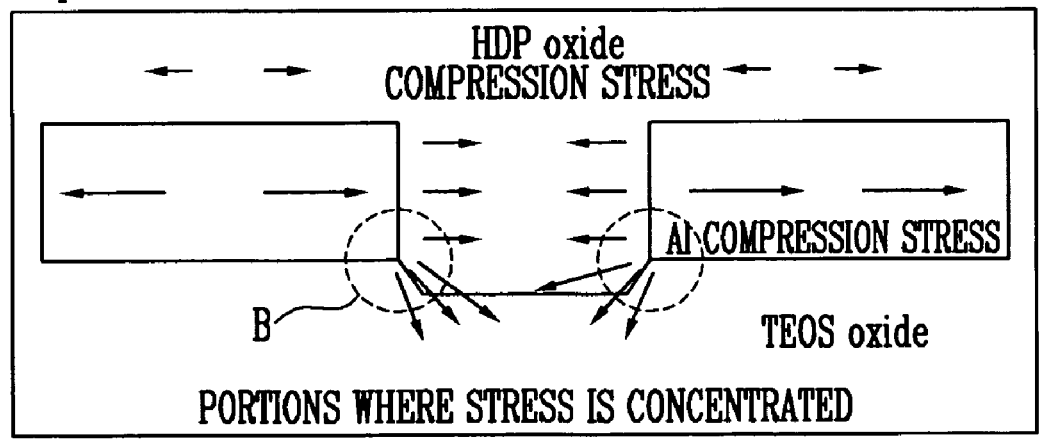
Figure 4C:
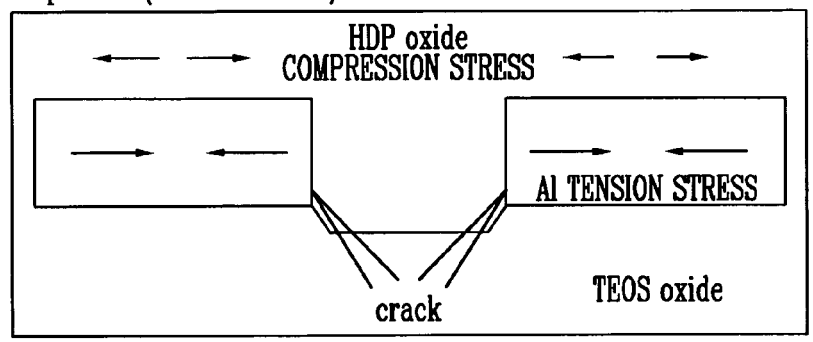
Figure 5:
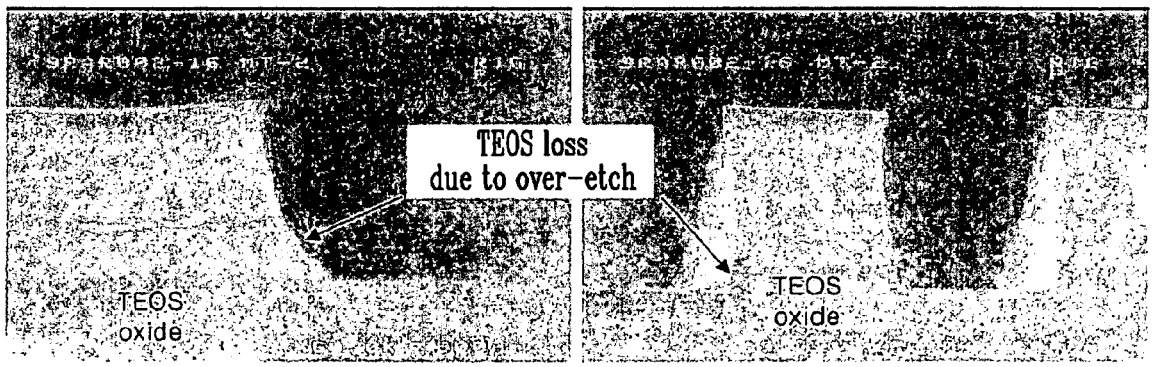
FIG. 5 is a view showing an Al etch profile.
Figure 6:
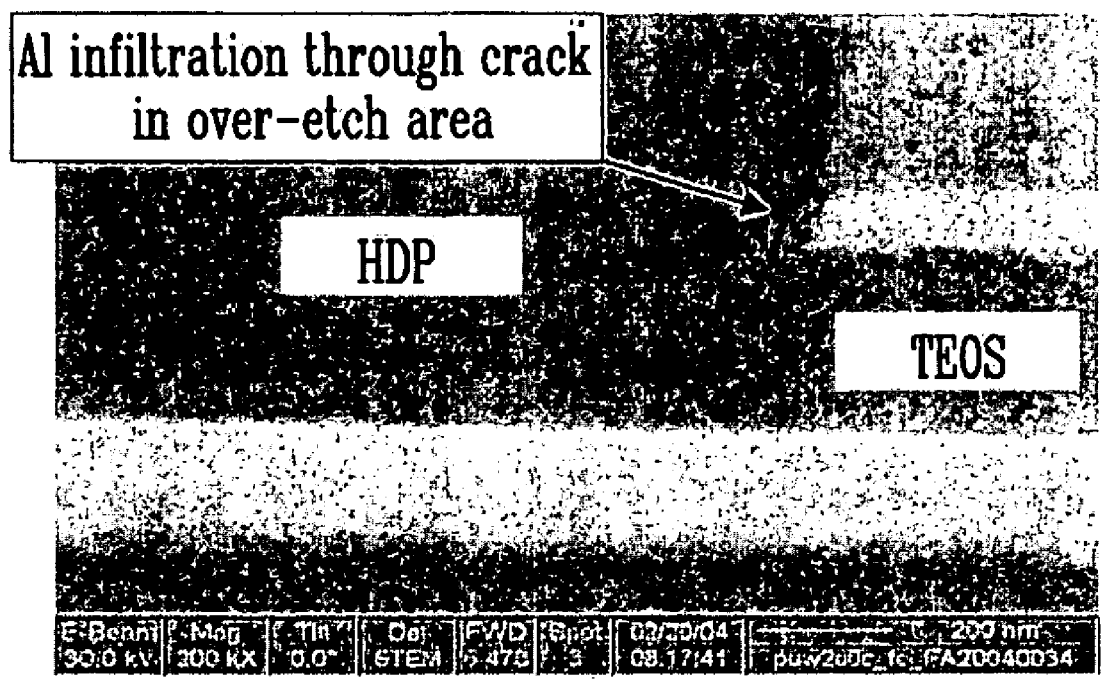
FIG. 6 is a SEM photograph showing cracking of an over-etch area and an Al infiltration phenomenon through the crack.
Figure 7:
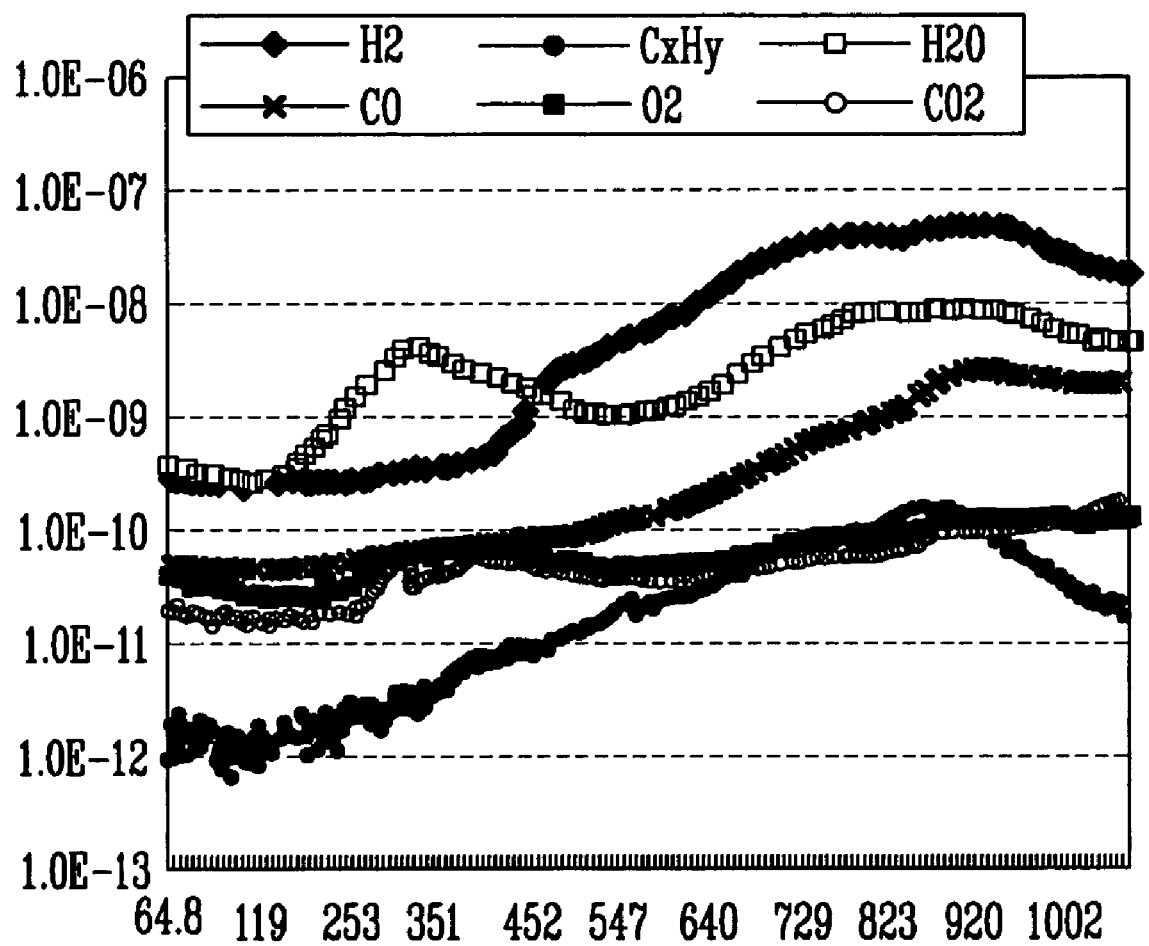
FIG. 7 is a graph showing the results of measuring impurities on the surface of a TEOS oxide film using SIMS.
Figure 8:
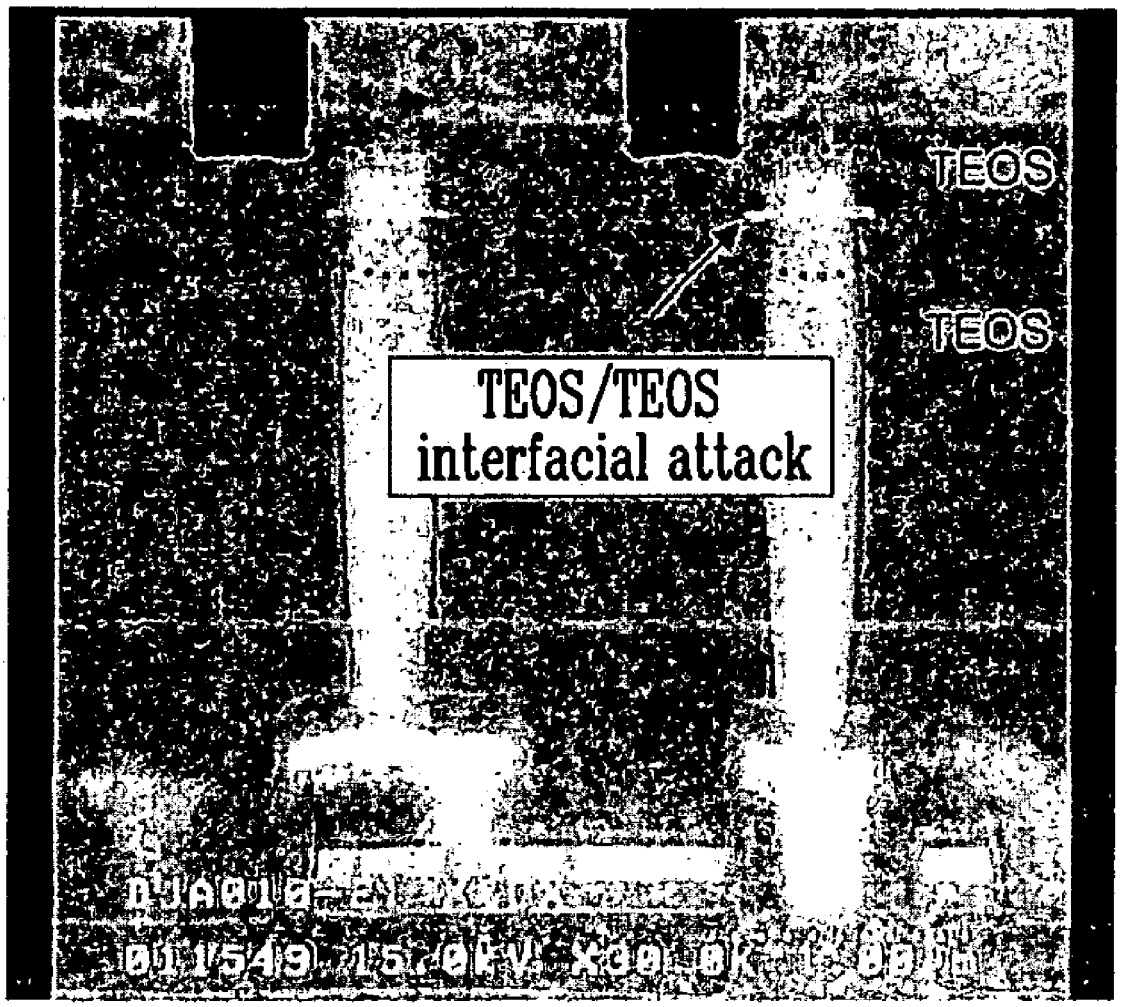
FIG. 8 shows the degree of TEOS/TEOS interface attack.
Figure 9A:
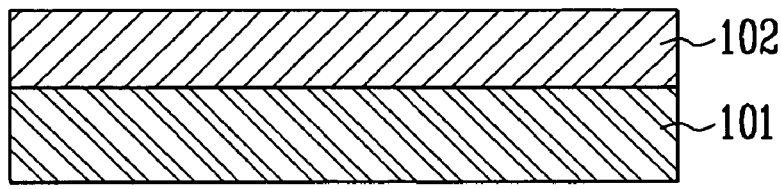
FIGS. 9A to 9D are cross-sectional views for explaining a general process of manufacturing a semiconductor device according to an embodiment of the present invention.

Referring first to FIG. 9A, a metal film 102 is formed on a substrate having a first insulating film 101 formed thereon. The metal film 102 is formed by depositing aluminum (Al).

Figure 9B:
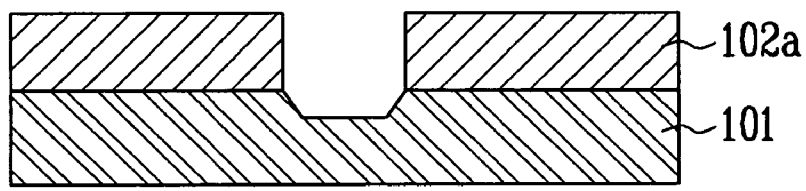

Referring next to FIG. 9B, the metal film 102 is patterned to form a metal line 102a.

In this case, a bottom corner area of the metal line 102a is over-etched by about 50% in order to prevent a bridge between the metal lines. The underlying first insulating film 101 is partially lost by mean of over-etch.

Figure 9C:
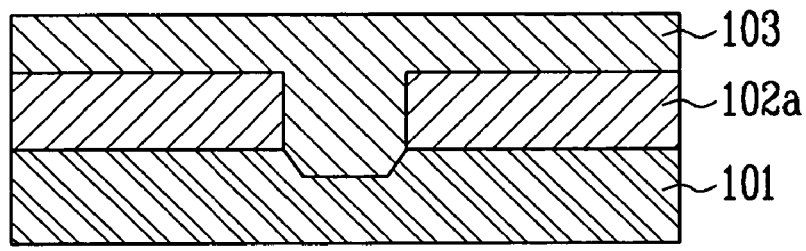

As shown in FIG. 9C, a second insulating film 103 is formed on the entire surface.

Figure 9D:
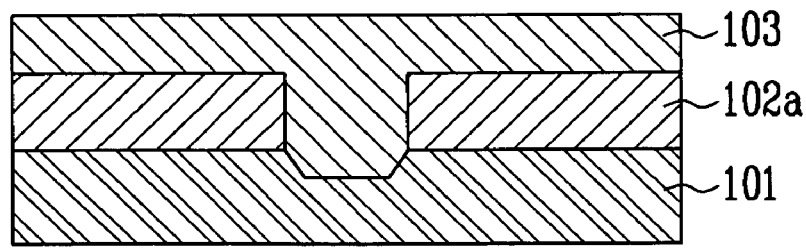

Thereafter, for the purpose of refresh characteristics and metal resistance stabilization, annealing is performed at a temperature of 450° C., as shown in FIG. 9D.

In this case, both the second insulating film 103 and the metal line 102a show compression stress, so that stress is concentrated on the bottom corners of the metal line.

First Embodiment

In the first embodiment of the present invention, before depositing the second insulating film 103 and after the metal line 102a is formed, a thermal treatment process is performed so as to reduce compression stress of the metal line 102a.

The thermal treatment process can be performed in a furnace under an $N_2$ and Ar gas atmosphere at a temperature of 300 to 450° C. for 20 to 60 minutes, or under an $N_2$ gas atmosphere at a temperature of 300 to 550° C. for 10 to 60 seconds by way of rapid thermal process (RTP).

Compression stress of the metal line 102a can be reduced through the aforementioned thermal treatment process. This can reduce a stress concentration phenomenon in a subsequent thermal treatment process (FIG. 9D) for refresh characteristics and metal resistance stabilization of the metal line 102a.

Second Embodiment

The second embodiment of the present invention includes changing stress of the metal line 102a by prohibiting melting of the metal line 102a. The metal line 102a is formed using a high melting point metal component.

A method for forming the metal line 102a including the high melting point metal component may include a method in which a high melting point material is distributed in the metal film 102 and is then enhanced when the metal film 102 is formed, and a method in which a high melting point material of 2 phases are deposited at the same time by means of a co-sputter method when the metal film 102 is formed.

For example, the metal line 102a can be formed by distributing $Al_2O_3$, W, etc. into Al metal and then enhancing it, or depositing a high melting point material such as $Al_2O_3$ and W together with Al by means of a co-sputter method.

As such, if the metal line 102a is formed to include the high melting point metal component, the metal line 102a is prevented from melting. Due to this, it is possible to prevent a stress concentration phenomenon in a subsequent thermal treatment process (FIG. 9D) for refresh characteristics and metal resistance stabilization of the metal line 102a.

Third Embodiment

In the third embodiment of the present invention, upon deposition of the second insulating film 103, a bias power is set to 3000 to 6000 Watts so as to reduce compression stress of the second insulating film 103.

Compression stress of the insulating film decreases if the bias power rises upon deposition of the insulating film. In the present invention, when the second insulating film 103 is deposited, the bias power is set sufficiently high in order to reduce compression stress of the second insulating film 103.

It is therefore possible to reduce compression stress of the second insulating film 103. Due to this, a stress concentration phenomenon in a subsequent thermal treatment process (FIG. 9D) for refresh characteristics and metal resistance stabilization of the metal line 102a can be reduced.

Fourth Embodiment

When the first and second insulating films 101 and 103 are heterogeneous films, i.e., in the case where the first insulating film 101 is comprised of a TEOS oxide film and the second insulating film 103 is comprised of a HDP oxide film, interfacial adhesion at the interface of the two films is poor, which causes a crack to occur.

Accordingly, in the fourth embodiment of the present invention, the first and second insulating films 101 and 103 are formed using the same kind of materials.

For example, both the first and second insulating films 101 and 103 can be formed of a TEOS oxide film, or both the first and second insulating films 101 and 103 can be formed of a HDP oxide film.

Therefore, according to the fourth embodiment of the present invention, as interfacial adhesive between the first and second insulating films 101 and 103 is enhanced, generation of a crack can be reduced.

Fifth Embodiment

When the first insulating film 101 is formed using the TEOS oxide film, a large amount of impurities, such as $H_2$, $C_xH_y$, $H_2O$, CO, $O_2$ and $CO_2$ is contained on the surface of the TEOS oxide film, which makes its interface very unstable.

Thus, in the fifth embodiment of the present invention, in the case where the first insulating film 101 is formed using the TEOS oxide film, the first insulating film 101 is formed using the TEOS oxide film, and a plasma treatment process is then performed on the first insulating film for the purpose of interfacial stabilization of the first insulating film 101.

The plasma treatment process can be performed under atmosphere containing one or more of Ar, $O_2$ and He using a bias power of 2000 to 6000 watts for 10 to 100 seconds.

As described above, according to the present invention, as compression stress of a metal line or a HDP oxide film can be reduced, compression stress can be reduced in a subsequent metal line thermal treatment process. It is thus possible to reduce generation of a crack caused by compression stress. Furthermore, by removing a heterogeneous interface becoming a cause of a crack, generation of a crack in a semiconductor device can be prevented. It is also possible to prevent generation of a crack in a semiconductor device by stabilizing the interface of an unstable TEOS oxide film.

Although the foregoing description has been made with reference to embodiments, it is to be understood that changes and modifications of the present invention may be made by a person of ordinary skill in the art without departing from the spirit and scope of the present invention and appended claims.

What is claimed is:

1. A method of manufacturing a semiconductor device, comprising:
    (a) forming a metal line on a first insulating film formed over a semiconductor substrate;
    (b) patterning the metal line and partially removing the first insulating film by an over-etch process;
    (c) reducing a compression stress of the metal line patterned by the over-etch process;
    (d) forming a second insulating film on the compression stress reduced metal line; and
    (e) performing a first thermal treatment process,
    wherein the step (c) is performed after the step (b) is completed and before the step (d) is performed.

2. The method as claimed in claim 1, wherein the compression stress of the metal line is reduced by a second thermal treatment process.

3. The method as claimed in claim 1, wherein the second thermal treatment process is performed in a furnace under an $N_2$ and Ar gas atmosphere at a temperature of 300 to 450° C. for 20 to 60 minutes or performed under an $N_2$ gas atmosphere at a temperature of 300 to 550° C. for 10 to 60 seconds by way of rapid thermal process (RTP).

4. A method of manufacturing a semiconductor device, comprising:
   (a) forming a metal line on a first insulating film formed over a semiconductor substrate,
   (b) patterning the metal line and partially removing the first insulating film by an over-etch process;
   (c) forming a second insulating film on the metal line; and
   (d) performing a thermal treatment process,
   wherein $Al_2O_3$ and W are included within the metal line in order to increase a melting point of the metal line.

5. The method as claimed in claim 4, wherein in the step (a), the $Al_2O_3$ and W are contained in the metal line as a high melting point material by means of a co-sputter method of depositing the aluminum and the high melting point material at the same time.

6. A method of manufacturing a semiconductor device, comprising:
   forming a first HDP oxide film over a semiconductor substrate;
   forming a metal line on the first HDP oxide film;
   patterning the metal line and partially removing the HDP oxide film by an over-etch process;
   forming a second HDP oxide film on the first HDP oxide film and the metal line patterned by the over-etch process; and
   performing a thermal treatment process.

7. A method of manufacturing a semiconductor device, comprising:
   forming a first TEOS oxide film over a semiconductor substrate;
   forming a metal line on the first TEOS oxide film;
   patterning the metal line and partially removing the TEOS oxide film by an over-etch process;
   forming a second TEOS oxide film on the first TEOS oxide film and the metal line patterned by the over-etch process; and
   performing a thermal treatment process.

8. The method as claimed in claim 4, wherein the metal line is formed of aluminum.

* * * * *